United States Patent
Chen et al.

(10) Patent No.: US 9,853,149 B1
(45) Date of Patent: Dec. 26, 2017

(54) FLOATING GRID AND CROWN-SHAPING POLY FOR IMPROVING ILD CMP DISHING

(71) Applicant: Taiwan Semiconductor Manufacturing Co., Ltd., Hsin-Chu (TW)

(72) Inventors: Chao-Hsuing Chen, Tainan (TW); Fu-Jier Fan, Hsinchu (TW); Yi-Huan Chen, Hsin Chu (TW); Kong-Beng Thei, Pao-Shan Village (TW); Ker-Hsiao Huo, Zhubei (TW); Szu-Hsien Liu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/283,722

(22) Filed: Oct. 3, 2016

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 29/78* | (2006.01) |
| *H01L 29/49* | (2006.01) |
| *H01L 29/51* | (2006.01) |
| *H01L 29/66* | (2006.01) |
| *H01L 29/06* | (2006.01) |
| *H01L 21/306* | (2006.01) |

(52) U.S. Cl.
CPC .... *H01L 29/7835* (2013.01); *H01L 21/30604* (2013.01); *H01L 21/30625* (2013.01); *H01L 29/0649* (2013.01); *H01L 29/4916* (2013.01); *H01L 29/517* (2013.01); *H01L 29/66545* (2013.01); *H01L 29/66659* (2013.01)

(58) Field of Classification Search
CPC .................................................. H01L 29/7835
USPC .................................................. 257/330, 382
See application file for complete search history.

(56) References Cited

U.S. PATENT DOCUMENTS

| | | | | |
|---|---|---|---|---|
| 6,261,923 B1 * | 7/2001 | Kuo | ........... | H01L 21/76229 257/E21.548 |
| 6,562,713 B1 * | 5/2003 | Belyansky | ........ | H01L 21/82345 257/E21.444 |
| 6,969,687 B2 * | 11/2005 | Levi | ........... | H01L 21/31053 257/E21.244 |
| 2002/0132492 A1 * | 9/2002 | Kim | ........... | H01L 21/31053 438/758 |

(Continued)

*Primary Examiner* — David S Blum
(74) *Attorney, Agent, or Firm* — Eschweiler & Potashnik, LLC

(57) ABSTRACT

The present disclosure relates an integrated circuit (IC) and a method for manufacturing same. A polysilicon layer is formed over a first region of a substrate and has a plurality of polysilicon structures that are packed with respect to one another to define a first packing density. A dummy layer is formed over a second region of the substrate and has a plurality of dummy structures that are packed with respect to one another to define a second packing density, where the first packing density and second packing density are substantially similar. An inter-layer dielectric layer is formed over the first region and second region of the substrate. Dishing of at least the second region of the substrate concurrent with a chemical-mechanical polish is generally inhibited by the first packing density and second packing density after forming the inter-layer dielectric layer.

20 Claims, 7 Drawing Sheets

(56) References Cited

U.S. PATENT DOCUMENTS

2003/0056191 A1* 3/2003 Chen ................. H01L 21/31053
                                                              257/754
2005/0205961 A1* 9/2005 Doong ............. H01L 21/76229
                                                              257/499
2011/0285036 A1* 11/2011 Yao .................... G03F 7/70633
                                                              257/797

* cited by examiner

FLOATING GRID AND CROWN-SHAPING POLY FOR IMPROVING ILD CMP DISHING

BACKGROUND

While many portable electronic devices, such as cameras, cell phones, tablets, etc., are designed to operate at low power to maximize the useful battery life of the devices between charges; many other applications, such as automotive ICs, avionics ICs, industrial control ICs, etc., demand higher power to move large loads, transfer power, communicate signals over large distances, etc. Because of this, high voltage (HV) power devices, such as HV metal oxide semiconductor field effect transistors (MOSFETs), are utilized in integrated circuits (ICs) for high-voltage switching and power applications. These HV MOSFETs have structural device features that enable them to withstand high currents and/or high voltages experienced during normal operating conditions.

BRIEF DESCRIPTION OF THE DRAWINGS

Aspects of the present disclosure are best understood from the following detailed descriptions when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
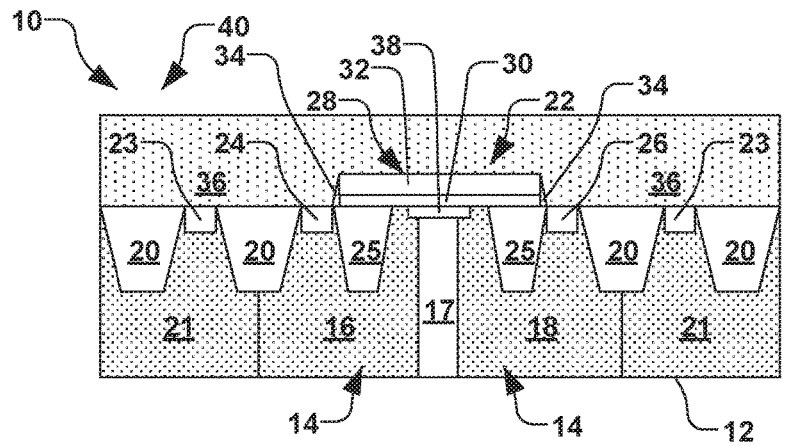
FIG. 1 illustrates a cross-sectional view of an integrated circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (e.g., rotated 90 degrees or at other orientations) and the spatially relative descriptors used herein may likewise be interpreted accordingly.

Planarization is a polishing process that is often performed in semiconductor processing, where a chemical slurry formulation and mechanical polishing process are utilized to remove unwanted conductive or dielectric materials on a substrate (e.g., a silicon wafer). Planarization techniques utilizing chemical mechanical polishing (CMP) on a substrate aim to achieve a flat and smooth surface upon which layers of integrated circuitry are built.

However, the efficacy of planarization techniques can depend on the structure(s) bring planarized. For example, various structures or regions of a particular layer can have a relatively high structural integrity, thus tending to "resist" CMP relatively well, while other structures or regions can have a relatively low structural integrity, where all such structures may be exposed to the same CMP process. As such, the structurally "weaker" regions, when performing CMP thereon, can lead to "dishing" of the structurally weaker regions, while the structurally "stronger" regions resist the planarization to a greater degree.

For high voltage (HV) device applications, wide polysilicon regions and areas of the substrate associated with wide oxide diffusion (OD) regions in an interlayer dielectric (ILD) layer can be problematic when planarizing such regions via chemical-mechanical polishing. For example, metal residue or inter-layer dielectric dishing may be present when performing CMP processing in conventional wide oxide diffusion or wide polysilicon regions, thus deleteriously affecting subsequent processes.

FIG. 1 is a sectional view of some embodiments of an exemplary integrated circuit 10. The integrated circuit 10 may comprise various microelectronic devices which are arranged on or in a substrate 12. The substrate 12 may be an elementary semiconductor such as silicon or germanium, and/or may also comprise a compound semiconductor such as silicon carbide, gallium arsenic, indium arsenide, and indium phosphide; and/or an alloy semiconductor such as silicon germanium, silicon germanium carbide, gallium arsenic phosphide, and gallium indium phosphide. Furthermore, the substrate 12 may be a bulk semiconductor substrate or may be a semiconductor-on-insulator (SOI) structure. For example, if present, the SOI structure may include a buried oxide (BOX) layer formed over a relatively thick handle wafer, which is provided for structural support. A relatively thin, high-quality device layer, which is often made of epitaxially grown semiconductor material, is disposed over the BOX layer and is separated from the handle wafer by the BOX layer. The integrated circuit 10 may comprise various microelectronic devices formed in the substrate 12. For example, the integrated circuit 10 may comprise an exemplary high voltage metal-oxide-semiconductor (HV-MOS) transistor 22. The HV-MOS transistor 22, for example, may be used in applications wherein 30 volts or higher power supply is provided during operation.

An isolation feature 20 can surround the HV-MOS transistor 22 to separate the HV-MOS transistor 22 from other devices formed on the substrate 12. The isolation feature 20 may be formed using a variety of manufacturing technologies. For example, the isolation feature 20 may comprise junction isolation, field isolation, dielectric isolation such as local oxidation of silicon (LOCOS) and/or shallow trench isolation (STI), or other suitable isolation structures. In one example, LOCOS isolation structures may be recessed into the substrate 12 and formed by thermal oxygen oxidation, steam oxidation, or another suitable process. A deep well region 21, which has a first conductivity type, for example p-type, also surrounds the HV-MOS transistor 22 to provide additional electrical isolation from other devices on the substrate 12. The deep well region 21 can be biased, for example, by one or more highly doped deep well contact regions 23 having the first conductivity type.

The HV-MOS transistor 22 may comprise a source 24 and a drain 26, which have a second conductivity type opposite the first conductivity type. The source 24 and drain 26 are embedded in the substrate 12, and can be formed by ion implantation or by epitaxial growth, for example. The source 24 and drain 26 may be separated from one another by a body region 17 which has the first conductivity type. The body region 17, in particular an upper portion of the body region 17, may also be referred to as a channel region in some contexts. In some embodiments, region 38 is a strain-inducing region, for example an epitaxially-grown SiGe or SiC region, or is an extra gate dielectric to help withstand high-voltages, or is a replacement channel region of epitaxially-grown silicon.

A gate stack 28 is arranged over the substrate 12 between the source 24 and the drain 26. The gate stack 28 may include a gate dielectric 30 formed on an upper surface of the substrate 12. The gate dielectric 30 may include silicon dioxide, silicon oxy-nitride, or a high dielectric-constant (k) material such as hafnium oxide, hafnium silicide, zirconium oxide, aluminum oxide, silicon nitride, tantalum pentoxide, or combinations thereof. The gate dielectric 30 may be formed by thermal oxidation, atomic layer deposition (ALD), chemical vapor deposition (CVD), physical vapor deposition (PVD), or other suitable processing. The gate stack 28 further comprises a gate electrode 32, disposed over the gate dielectric 30. The gate electrode 32, for example, may comprise polycrystalline silicon (polysilicon), or a metal such as Al, Cu, W, Ti, Ta, TiN, TaN, NiSi, CoSi, and/or other conductive material. The gate electrode 32 may be formed by CVD, PVD, plating, ALD, and/or other suitable processes. Gate spacers 34 can be positioned on both sides of the gate stack 28. The gate spacers 34 may comprise silicon nitride, silicon oxide, silicon carbide, silicon oxy-nitride, or combinations thereof. The gate spacers 34 may have multilayer structure and may be formed by depositing dielectric material and then anisotropically etching back the dielectric material. The gate stack 28 is disposed in an inter-layer dielectric (ILD) layer 36, which can be made of silicon dioxide or a low-k dielectric material, for example.

In some embodiments, the first conductivity type is p-type, such that the deep well region 21 and body region 17 are made of p-type material, and the second conductivity type is n-type, such that the source 24, drain 26, and first and second source/drain extension region 16, 18 are n-type, but it will be appreciated that alternatively these conductivity types can be "flipped" in other implementations, such that the first conductivity type can be n-type and the second conductivity type can be p-type.

During operation, depending on the bias condition applied to the HV-MOS transistor 22, the body region 17 can selectively electrically isolate the source 24 from drain 26 or can selectively couple the source 24 to drain 26. For example, in instances where the source 24 and drain 26 are n-type regions and the body region 17 is a p-type region (which corresponds to a n-type HV-MOS transistor), when a positive gate-source voltage having a voltage magnitude larger than a so-called threshold voltage of the transistor is applied, the HV-MOS transistor 22 is deemed to be "on" and current will flow between source 24 and drain 26. In contrast, if a voltage that is less than the threshold voltage is applied, the HV-MOS transistor 22 is deemed to be "off" and little or no current will flow between source 24 and drain 26. This is because the applied bias can selectively induce a conductive channel in the body region 18, wherein the presence or absence of the conductive channel depends on the magnitude and polarity of the applied bias.

To help the HV-MOS transistor 22 withstand high-voltages, a first source/drain extension region 16, which corresponds to a well region having the second conductivity type (e.g., n-type) is disposed under the gate stack 28 and between the source 24 and the body region 17. A second source/drain extension region 18, which also corresponds to a well region having the second conductivity type is disposed under the gate stack 28 and between the drain 26 and the body region 17. In some embodiments, the first and second source/drain extension regions 16, 18, have a lower doping concentration than the source 24 and drain 26. The first and second source/drain extension regions 16, 18 can act as resistors in some regards, such that a high voltage between source 24 and drain 26 can be dissipated over a longer length, compared to if the source/drain extension regions 16, 18 were not present. This increased length and resistance helps to reduce the possibility of highly localized voltage drops between the source 24 and drain 26, and thus, makes the HV MOS transistor 22 more immune to voltage breakdown. Shallow trench isolation regions 25 are also arranged under the gate stack 28, and may comprise junction isolation, field isolation, dielectric isolation such as local oxidation of silicon (LOCOS) and/or shallow trench isolation (STI). These shallow trench isolation regions 25 are arranged within the first and second source/drain extension regions 16, 18, and drive current deeper into the substrate 12 to further help the HV-MOS transistor 22 to withstand high voltages.

Figure 2:
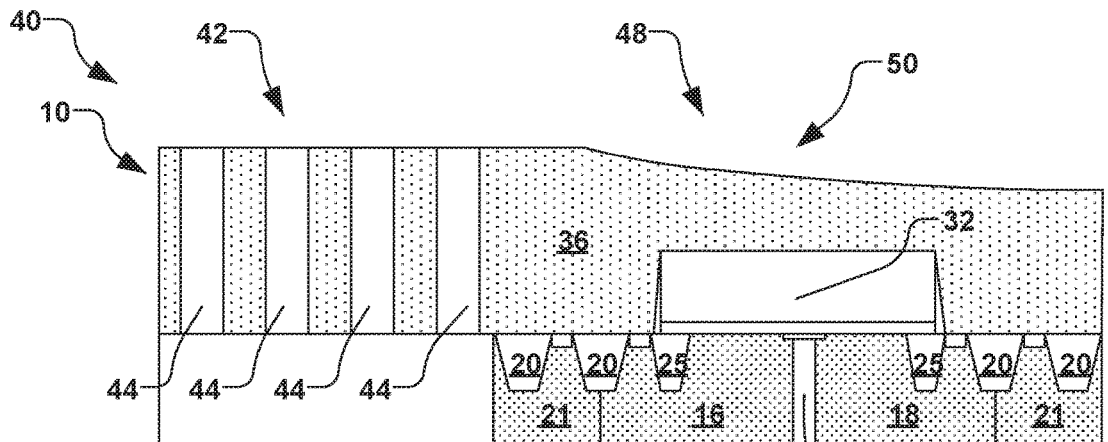
FIG. 2 illustrates a cross-sectional view of an integrated circuit in accordance with some embodiments.

Although the first and second source/drain extensions 16, 18 and STI regions 25 help to improve voltage breakdown, they also make the gate electrode 32 "wider" or "longer". Aspects of this disclosure appreciate that this wider or longer gate electrode can lead to packing density differences and CMP uniformity issues for different parts of the integrated circuit, particularly when wider or longer gate electrodes are disposed on the same substrate as densely packed polysilicon structures. FIG. 2 illustrates an example view 40 of the integrated circuit 10 of FIG. 1, wherein a dense polysilicon region 42 having a plurality of polysilicon structures 44 is provided proximate to a HV MOS transistor covered by a wide stretch of a continuous interlayer dielectric layer. The dense polysilicon region 42 can correspond, for example, to polysilicon gate structures of a dense memory array. In the example of FIG. 2, upper surfaces of the polysilicon structures are at a first height above an upper surface of the semiconductor substrate, and are higher than an upper surface of the gate stack of HV MOS transistor 22. Because of this height difference and because of differences in structural integrity of the interlayer dielectric layer 36 and polysilicon regions, upon performing a planarization using CMP, the dense polysilicon region 42 is conventionally polished at a slower rate than the active device region 48, whereby substantial dishing 50 is present over the active device region. This is due to the interlayer dielectric layer 36 being polished or removed at a significantly greater rate than the polysilicon structures 44.

Figure 3:
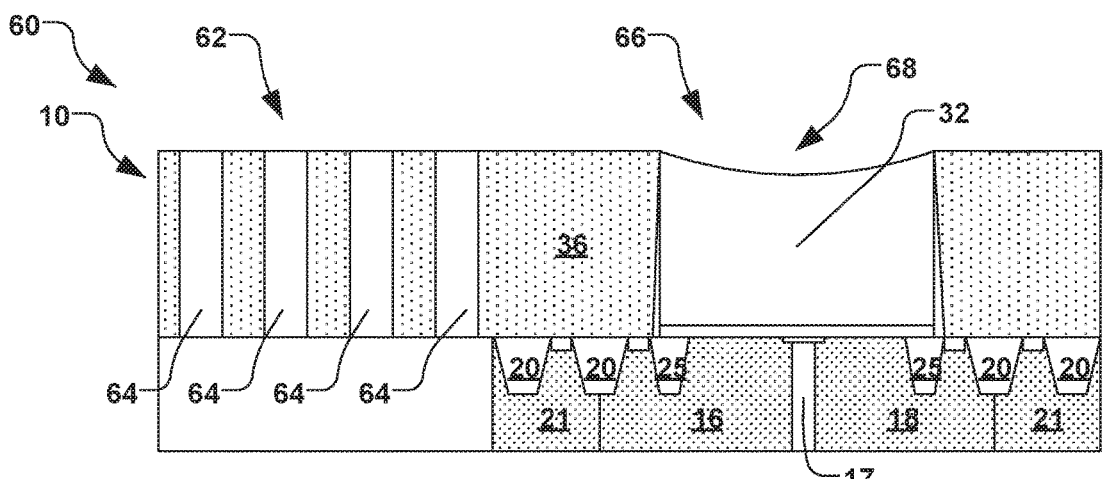
FIG. 3 illustrates a cross-sectional view of an integrated circuit in accordance with some embodiments.

FIG. 3 shows alternative example of the integrated circuit of FIG. 1 which includes a dense polysilicon region and a HV MOS transistor. In contrast to FIG. 2, in FIG. 3 the gate stack of the HV MOS transistor has an upper surface that is at the same height as (or higher than) upper surfaces of the plurality of polysilicon structures 64 in dense polysilicon region 62. In FIG. 3, the dense polysilicon region 62 is polished at a slower rate than the gate stack 66. Thus, in the example of FIG. 3, upon chemical-mechanical polishing, substantial dishing 68 is present over the wide polysilicon region of gate stack 66, as the interlayer dielectric layer 36 is polished or removed at a significantly greater rate than the polysilicon structures 44.

The present disclosure advantageously proposes to add dummy structures directly above such an active device region or wide oxide diffusion region, such that when planarizing such regions via chemical-mechanical polishing, a generally planar surface is provided without such dishing effects. Similarly, when a wide polysilicon structure is present adjacent to the densely-packed polysilicon structures, dummy structures are formed above the wide polysilicon structure in order to similarly avoid dishing of the wide polysilicon structure. The dummy structures of the present disclosure are configured to protect underlying lower layers from dishing during planarization, and thus results in more uniform metal lines and subsequent structures formed over the IC.

Accordingly, the present disclosure relates to a structure and method for forming an integrated circuit having a dummy structure disposed at a peripheral region of a wide polysilicon region or active device region. According to one example embodiment of the disclosure, as illustrated in FIGS. 4A-4E, an integrated circuit 100 comprises a plurality of polysilicon structures 102 disposed within an inter-layer dielectric (ILD) layer 104 above a substrate 106, wherein the plurality of polysilicon structures are packed with respect to one another to define a first packing density 108. The substrate 106, for example, comprises a portion of a silicon wafer or other semiconductor substrate or layers formed thereon. In one example of the present embodiment, a wide oxide diffusion (OD) region 110 of the inter-layer dielectric layer 104 is provided, wherein the wide oxide diffusion region is disposed proximate to the plurality of polysilicon structures 102. The wide oxide diffusion region 110, for example, is generally defined by an active device 112, such as a HV MOS transistor, associated with the substrate 106. In the present example, the wide oxide diffusion region 110 resides over the active device 112 in an active device region 114.

Figure 4A:
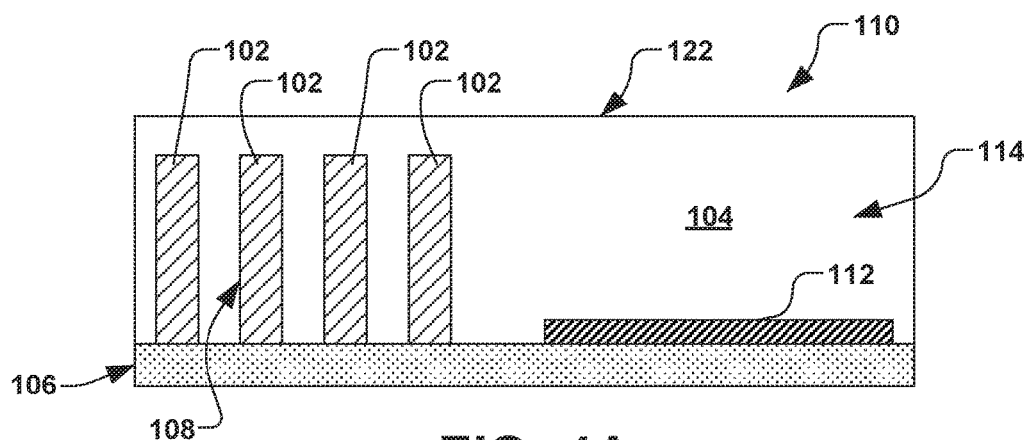
FIGS. 4A-4E illustrate a series of cross-sectional views that collectively depict an example method of manufacturing an integrated circuit in accordance with some embodiments
Figure 4B:
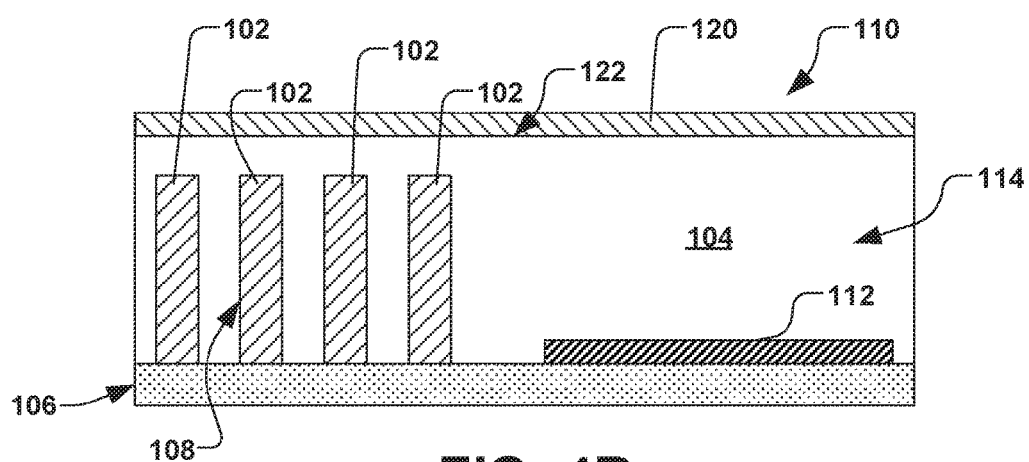
Figure 4C:
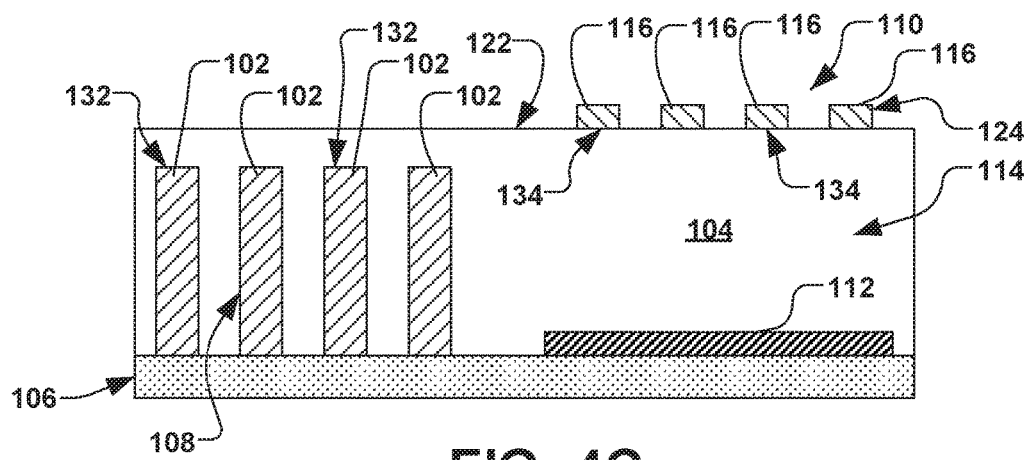
Figure 4D:
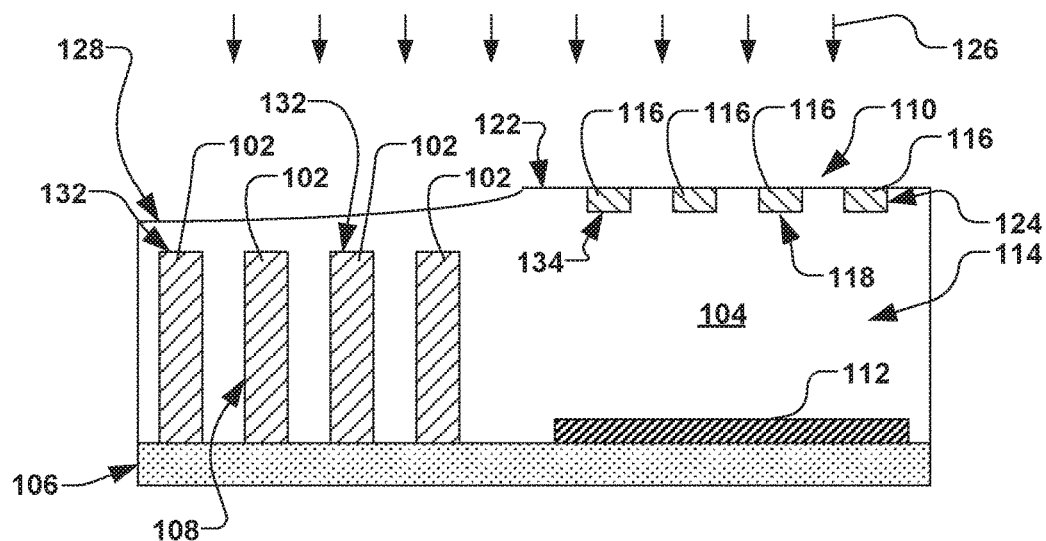

In accordance with an example of the disclosure, a plurality of dummy structures 116 are further disposed directly above the wide oxide diffusion region 110, as illustrated in FIGS. 4C-4D, wherein the plurality of dummy structures are packed with respect to one another to define a second packing density 118. The plurality of dummy structures 116, in accordance with one example, are comprised of one or more of polysilicon and silicon nitride. For example, as illustrated in FIG. 4B, a dummy layer 120 comprising polysilicon or silicon nitride is formed or deposited over an upper surface 122 of the inter-layer dielectric layer 104 of FIG. 4A. FIG. 4C and FIG. 4D illustrate the result of patterning and etching the dummy layer 120 of FIG. 4B, thereby defining the plurality of dummy structures 116 of FIGS. 4C-4D. After the plurality of dummy structures 116 are patterned and etched, another inter-layer dielectric layer is formed or deposited over the patterned dummy structures, such that inter-layer dielectric material resides between outer sidewalls of the patterned dummy structures and separates neighboring dummy structures from one another.

In accordance with one exemplary aspect, the first packing density 108 associated with the plurality of polysilicon structures 102 and the second packing density 118 of the plurality of dummy structures 116 are substantially similar. Therefore, the plurality of dummy structures 116 generally define an anti-dishing structure 124 of FIGS. 4C-4D, wherein the anti-dishing structure is configured to generally inhibit a dishing of the upper surface 122 of the inter-layer dielectric layer 104 in the wide oxide diffusion region 110 concurrent with a chemical-mechanical polish of the upper surface of the inter-layer dielectric layer. As illustrated in FIG. 4D, for example, a chemical-mechanical polish (illustrated by arrows 126) may lead to a minor dishing 128 of the inter-layer dielectric layer 104 over the plurality of polysilicon structures 102 while the chemical-mechanical polish is being performed. However, upon removal of the plurality of dummy structures 116 by the chemical-mechanical polish 126 of FIG. 4D, a substantially planar surface 130 of both the upper surface 122 of inter-layer dielectric layer 104 and an upper surface 132 of the plurality of polysilicon structures 102 is provided in FIG. 4E due to the aid of the plurality of dummy structures, whereby no dishing is evidenced in the wide oxide diffusion region 110.

Figure 4E:
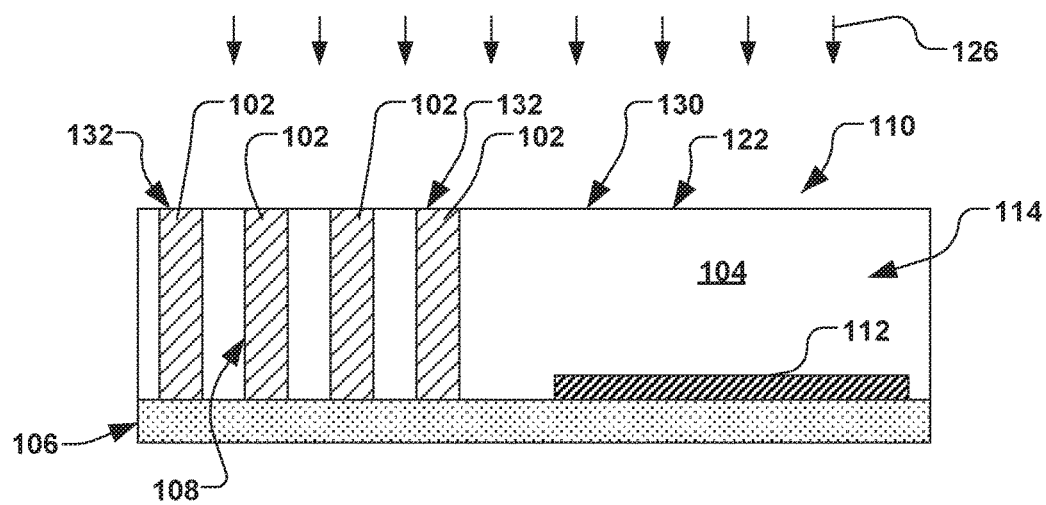

In accordance with another example, as illustrated in FIG. 4C-4D, the upper surface 132 of the plurality of polysilicon structures 102 is below a lower surface 134 of the plurality of dummy structures 116. In the present example, the inter-layer dielectric layer 104 further resides between the upper surface 132 of the plurality of polysilicon structures 102 and lower surface 134 of the plurality of dummy structures 116. Such a positioning of the upper surface 132 of the plurality of polysilicon structures 102 and lower surface 134 of the plurality of dummy structures 116 with the inter-layer dielectric layer 104 disposed therebetween allows any of the minor dishing 128 of the inter-layer dielectric layer over the plurality of polysilicon structures to be removed when the upper surface 122 of the inter-layer dielectric layer is planarized, as seen in FIG. 4E. In some embodiments of FIGS. 4D-4E, the anti-dishing structure 124 is structured such that a single CMP pad and slurry composition can be used starting at an upper surface of the dummy structures 116 and polishing conditions, such as wafer temperature, slurry temperature, downforce, and rotational speeds of the wafer and platen, can remain substantially constant until the planar surface illustrated in FIG. 4E is established.

According to another example embodiment of the disclosure, as illustrated in FIGS. 5A-5E, another integrated circuit 200 comprises a plurality of polysilicon structures 202 disposed within an inter-layer dielectric (ILD) layer 204 above a substrate 206, wherein the plurality of polysilicon structures are packed with respect to one another to define a first packing density 208. The substrate 206, for example, comprises a portion of a silicon wafer or other semiconductor substrate or layers formed thereon. In one example of the present embodiment, a wide polysilicon structure 210 is provided, wherein the wide polysilicon structure is disposed proximate to the plurality of polysilicon structures 102. The wide polysilicon structure 210, for example, is generally defined by a gate device 212 associated with the substrate 206. In the present example, the wide polysilicon structure 210 resides in a gate region 214.

Figure 5A:
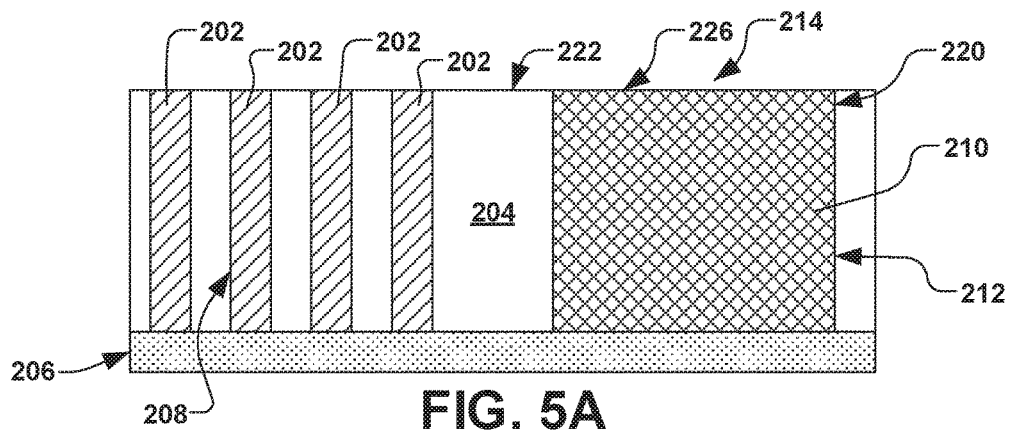
FIGS. 5A-5E illustrate a series of cross-sectional views that collectively depict an example method of manufacturing an integrated circuit in accordance with some embodiments.
Figure 5B:
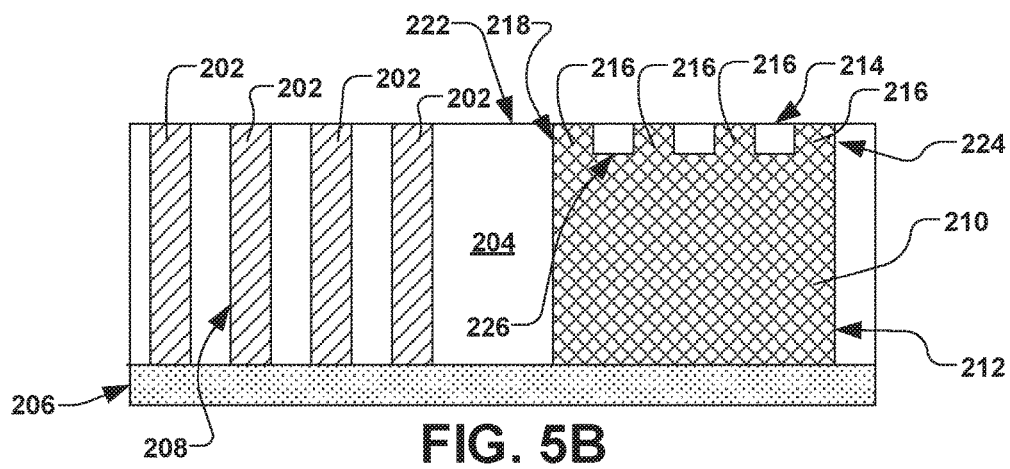
Figure 5C:
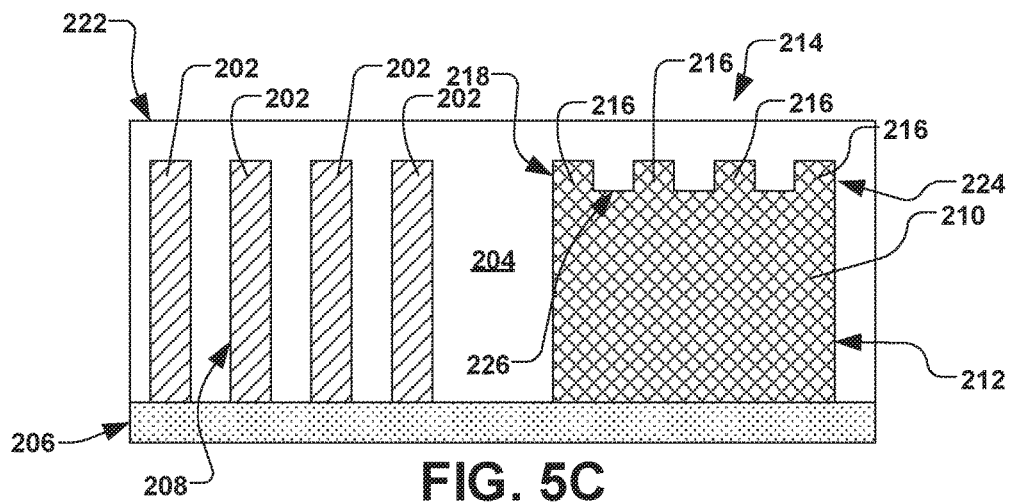
Figure 5D:
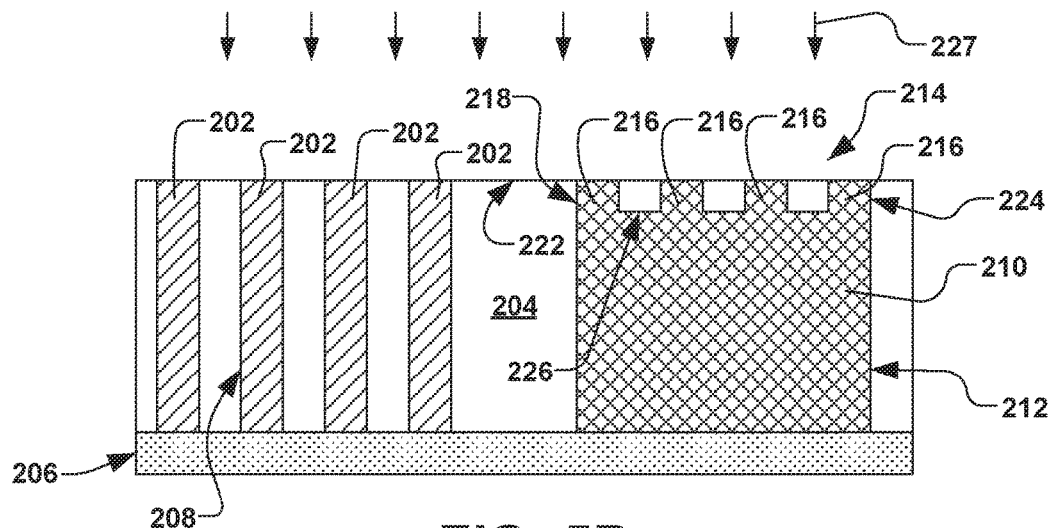
Figure 5E:
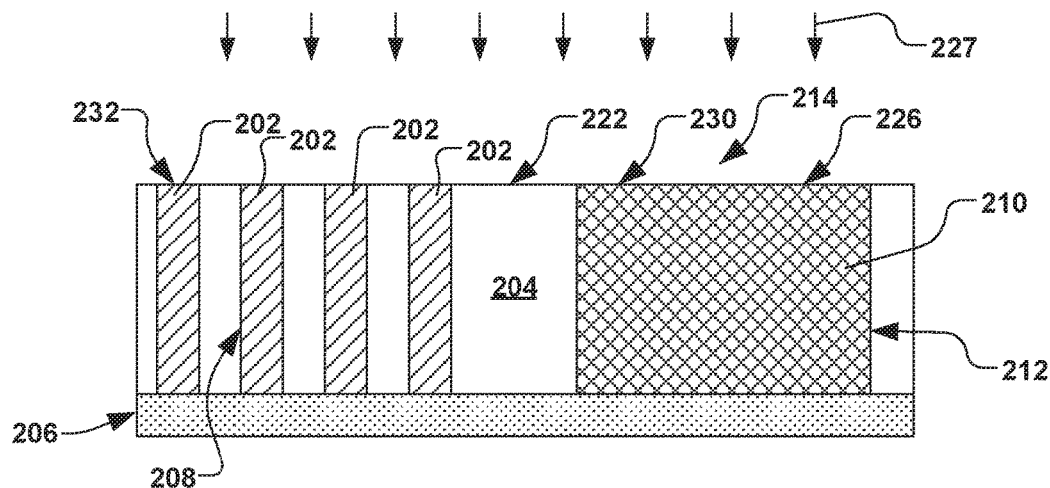

In accordance with an example of the disclosure, a plurality of dummy structures 216 are further disposed directly above (e.g., directly contacting) the wide polysilicon structure 210, as illustrated in FIGS. 5B-5D, wherein the plurality of dummy structures are packed with respect to one another to define a second packing density 218. The plurality of dummy structures 216, in accordance with one example, are comprised of polysilicon (e.g., the same material as the wide polysilicon structure 210). For example, as illustrated in FIG. 5B, an upper region 220 of the wide polysilicon structure 210 is patterned and etched to define the plurality of dummy structures 216 of FIGS. 5B-5D associated with an upper surface 222 of the inter-layer dielectric layer 204.

In accordance with one exemplary aspect, the first packing density 208 associated with the plurality of polysilicon structures 202 and the second packing density 218 of the plurality of dummy structures 216 are substantially similar. Therefore, the plurality of dummy structures 216 generally define an anti-dishing structure 224 of FIGS. 5B-5D, wherein the anti-dishing structure is configured to generally inhibit a dishing of an upper surface 226 of the wide polysilicon structure 210 in the gate region 214 concurrent with a chemical-mechanical polish of the upper surface of the inter-layer dielectric layer. As illustrated in FIG. 4D, for example, a chemical-mechanical polish (illustrated by arrows 227) substantially planarizes the inter-layer dielectric layer 204 over the plurality of polysilicon structures 202. Further, upon removal of the plurality of dummy structures 216 by the continuation of the chemical-mechanical polish 227 of FIG. 5E, a substantially planar surface 230 of both the upper surface 222 of inter-layer dielectric layer 204, an upper surface 232 of the plurality of polysilicon structures 202, and the upper surface 226 of the wide polysilicon structure 210 is provided due to the aid of the plurality of dummy structures, whereby no dishing of the wide polysilicon structure is evidenced.

In yet another example, the wide polysilicon structure has a width that is substantially greater than a width of one or more of the plurality of polysilicon structures. Each of the plurality of dummy polysilicon structures for example, has a width in a range of from about 200 Å to about 300 Å.

Figure 6:
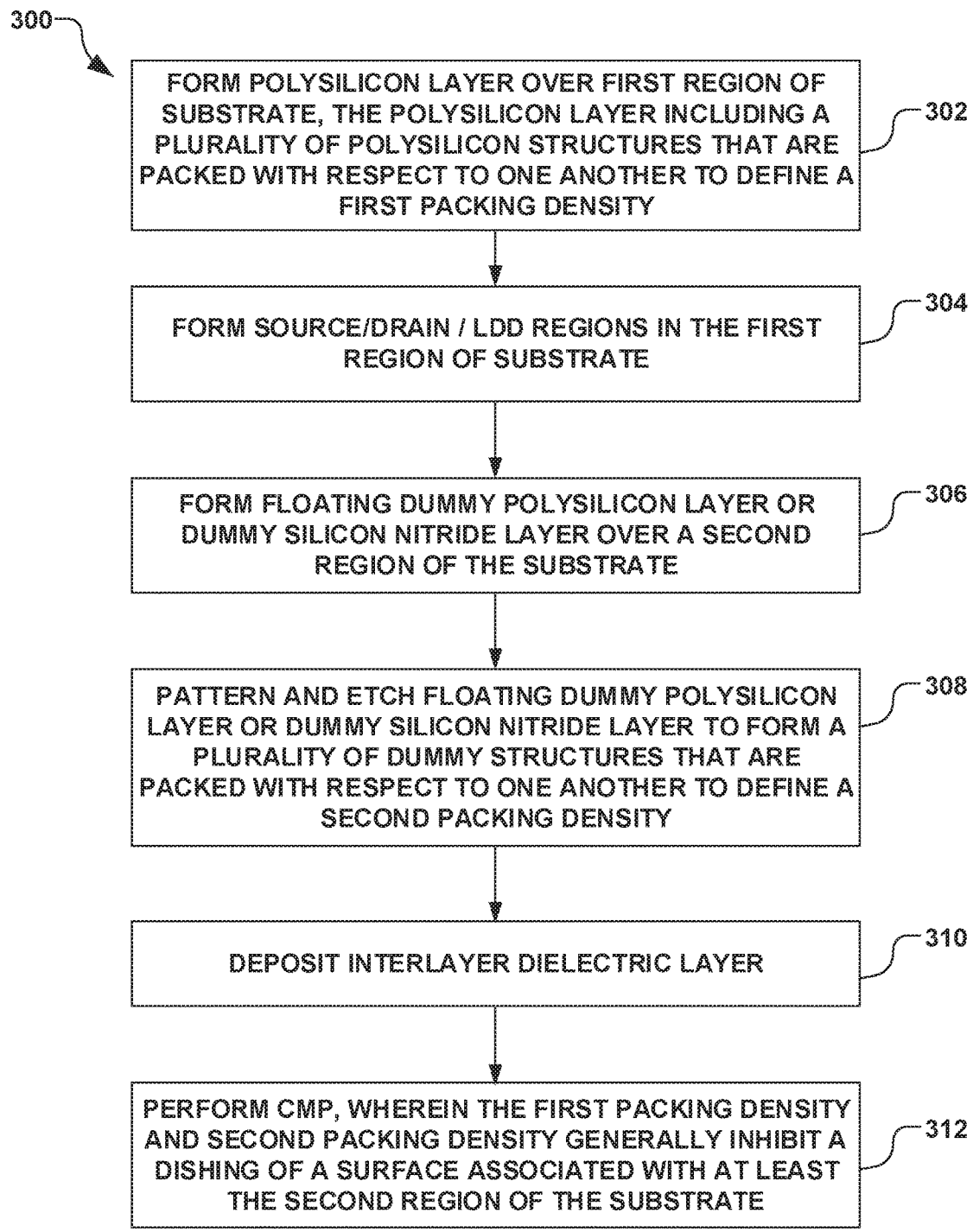
FIG. 6 illustrates a flowchart for a method of manufacturing an integrated circuit in accordance with some embodiments.

FIG. 6 illustrates a flow diagram of a method 300 of manufacturing an integrated circuit (IC) according to some embodiments. While disclosed method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In accordance with one aspect of the disclosure, in act 302 of the method 300 illustrated in FIG. 6, a polysilicon layer is formed over a first region of the substrate. Thus, in some embodiments, act 302 can correspond to previously illustrated FIG. 4A, wherein the polysilicon layer of act 302 corresponds to a plurality of polysilicon structures 102 that are packed with one another to define a first packing density. In act 304, source and drain regions and lightly doped drain (LDD) regions are formed, such as in a wide oxide diffusion (OD) region. Wide oxide diffusion regions, for example, are used for generally defining active areas, such as in p- and n-active areas. In act 306, a floating dummy polysilicon layer is formed over the substrate. In some embodiments, act 306 can correspond to previously illustrated FIG. 4B, where a dummy polysilicon layer 120 was formed. Alternatively, in act 306, a silicon nitride (SiN) layer is formed over the substrate. In act 308, the floating dummy polysilicon layer is patterned and etched. In some embodiments, act 308 can correspond to previously illustrated FIG. 4C, where the dummy polysilicon layer 120 was patterned and etched to form a plurality of dummy structures 116 that are packed to define a second packing density. If a silicon nitride layer is formed in act 306, act 308 comprises patterning and etching the silicon nitride layer.

In act 310, an inter-layer dielectric (ILD) layer is deposited over the substrate. In some embodiments, act 310 can correspond to previously illustrated FIG. 4D (prior to planarization), where an inter-layer dielectric layer 124 was formed between sidewalls of the dummy structures 116. In act 312, the inter-layer dielectric layer undergoes a chemical-mechanical polish (CMP) process, whereby the dummy floating poly pattern is removed and the substrate is planarized to the dense poly region, whereby the floating dummy poly layer or SiN patterning generally provides a CMP hard mask on top of the wide oxide diffusion (OD) region. In some embodiments, act 312 can correspond to previously illustrated FIGS. 4D-4E, where planarization is carried out.

Figure 7:
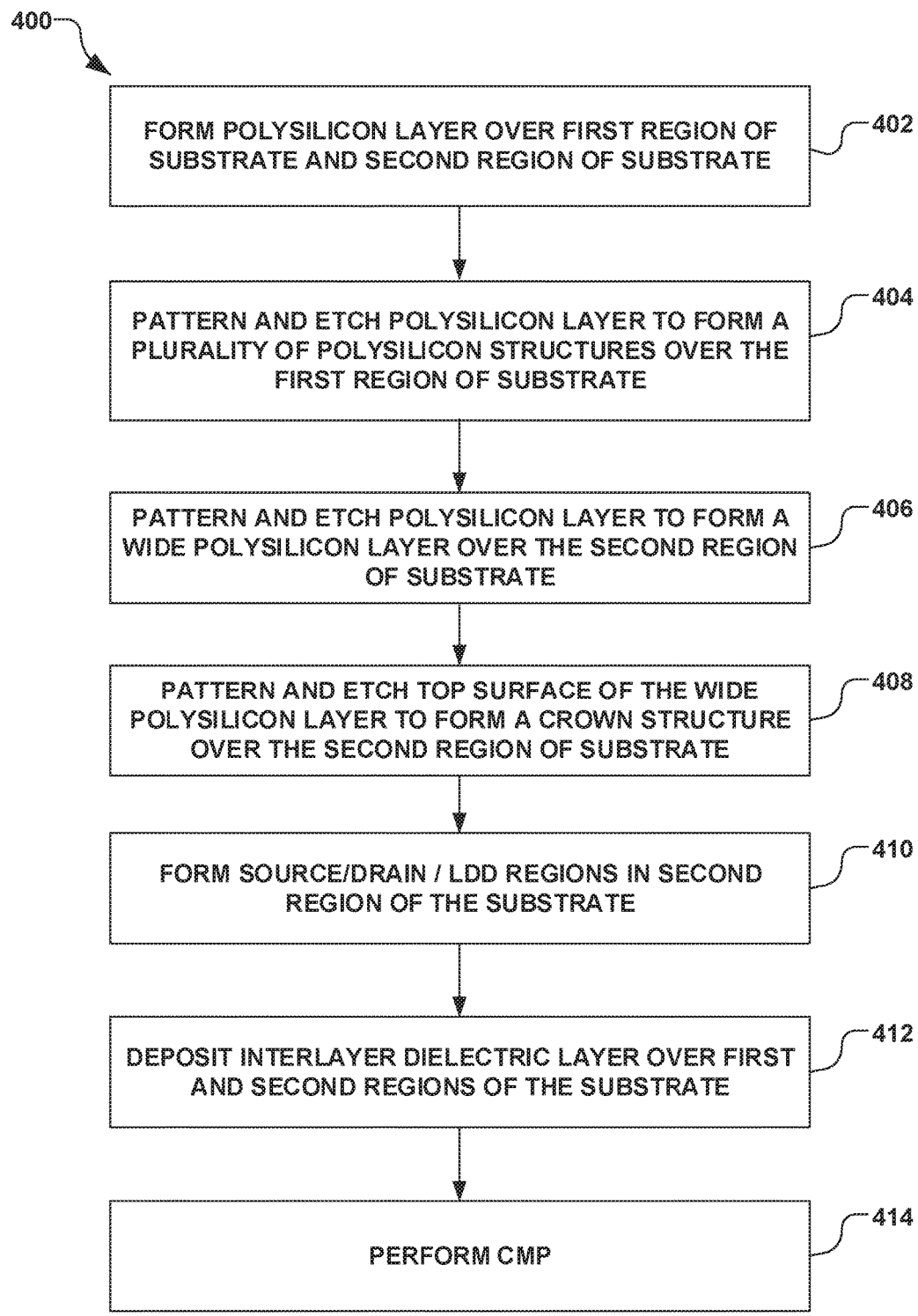
FIG. 7 illustrates a flowchart for a method of manufacturing an integrated circuit in accordance with some embodiments.

In accordance with yet another aspect of the disclosure, FIG. 7 illustrates another method 300, wherein in act 402, a polysilicon layer is formed over a first region and second region of a substrate. In 404, the polysilicon layer is patterned and etched to form a plurality of polysilicon structures over the first region of the substrate. In some embodiments, act 404 can correspond to previously illustrated FIG. 5A, where a plurality of polysilicon structures 202 are formed. In act 406, a wide polysilicon structure is patterned. In some embodiments, act 406 can correspond to previously illustrated FIG. 5A, where a wide polysilicon structure 210 is formed over a second region of the substrate, which is non-overlapping with the first region of the substrate. In act 408, the wide polysilicon structure is etched to define a plurality of dummy structures, and in particular, an upper surface of the wide polysilicon structure is etched to form a crown structure over the second region of the substrate. In some embodiments, act 408 can correspond to previously illustrated FIG. 5B, where a plurality of polysilicon structures 216 are formed. In act 410, source and drain regions and/or lightly doped drain (LDD) regions are formed, and in act 412, an interlayer dielectric layer is deposited. Thus, in some embodiments, act 412 can correspond to previously illustrated FIG. 5C. In act 414, a chemical-mechanical polish (CMP) process is performed, whereby the dummy structures are removed and the substrate is planarized to the dense poly region, whereby a density of the dummy structures generally compensate for a density of the plurality of polysilicon structures. Thus, in some embodiments, act 414 can correspond to previously illustrated FIGS. 5D-5E.

In some embodiments, the present disclosure relates to a method for manufacturing an integrated circuit. The method comprises forming a polysilicon layer over a first region of a substrate, wherein the polysilicon layer comprises a plurality of polysilicon structures that are packed with respect to one another to define a first packing density. A dummy layer is formed over a second region of the substrate, wherein the dummy layer comprises a plurality of dummy structures that are packed with respect to one another to define a second packing density, wherein the first packing density and second packing density are substantially similar. An inter-layer dielectric layer is further formed over the first region and second region of the substrate, and a chemical-mechanical polish is performed on the substrate after forming the inter-layer dielectric layer, wherein the first packing density and second packing density generally inhibit a dishing of a surface associated with at least the second region of the substrate.

In accordance with another exemplary aspect of the disclosure, an integrated circuit is provided comprising a semiconductor substrate having an interlayer dielectric layer, a dense polysilicon region, and one or more of a wide oxide diffusion (OD) region in the interlayer dielectric layer and a wide polysilicon structure. The dense polysilicon region, for example, comprises a plurality of polysilicon structures that packed with respect to one another to define a first packing density. A plurality of dummy structures are arranged directly above the one or more of the wide oxide diffusion region and wide polysilicon structure, wherein the plurality of dummy structures are packed with respect to one another to define a second packing density. The first packing density and second packing density are substantially similar, wherein the plurality of dummy structures define an anti-dishing structure configured to generally inhibit a dishing of a surface of the one or more of the wide oxide diffusion region and wide polysilicon structure concurrent with a subsequent removal of the plurality of dummy structures via a chemical-mechanical polish of a surface of the semiconductor substrate.

In yet another embodiment, the present disclosure relates to an integrated circuit (IC). The IC includes a semiconductor substrate having an interlayer dielectric layer, a dense polysilicon region, and one or more of a wide oxide diffusion (OD) region in the interlayer dielectric layer and a wide polysilicon structure. The dense polysilicon region comprises a plurality of polysilicon structures that packed with respect to one another to define a first packing density. A plurality of dummy structures are arranged directly above the one or more of the wide oxide diffusion region and wide polysilicon structure. The plurality of dummy structures are packed with respect to one another to define a second packing density, wherein the first packing density and second packing density are substantially similar. The plurality of dummy structures define an anti-dishing structure configured to generally inhibit a dishing of a surface of the one or more of the wide oxide diffusion region and wide polysilicon structure concurrent with a subsequent removal of the plurality of dummy structures via a chemical-mechanical polish of a surface of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) defined in a substrate, comprising:
   a plurality of polysilicon structures disposed within an inter-layer dielectric (ILD) layer of the substrate, wherein the plurality of polysilicon structures are packed with respect to one another to define a first packing density;
   one of a wide oxide diffusion (OD) region of the inter-layer dielectric layer or a wide polysilicon structure, wherein the wide oxide diffusion region or wide polysilicon structure is disposed proximate to the plurality of polysilicon structures; and
   a plurality of dummy structures disposed directly above the respective wide oxide diffusion region or wide polysilicon structure, wherein the plurality of dummy structures are packed with respect to one another to define a second packing density, wherein the first packing density and second packing density are substantially similar, and wherein the plurality of dummy structures define an anti-dishing structure configured to generally inhibit a dishing of a surface of the respective wide oxide diffusion region or the wide polysilicon structure concurrent with a chemical-mechanical polish of a surface of the substrate.

2. The integrated circuit of claim 1, wherein the plurality of dummy structures are comprised of one or more of polysilicon and silicon nitride.

3. The integrated circuit of claim 1, wherein an upper surface of the plurality of polysilicon structures is below an upper surface of the plurality of dummy structures.

4. The integrated circuit of claim 3, wherein the upper surface of the plurality of polysilicon structures is below a lower surface of the plurality of dummy structures.

5. The integrated circuit of claim 1, wherein the wide oxide diffusion region resides over an active device region.

6. The integrated circuit of claim 1, wherein the plurality of dummy structures are defined in an upper surface of the wide polysilicon structure.

7. The integrated circuit of claim 1, wherein the wide polysilicon structure has a width that is substantially greater than a width of one or more of the plurality of polysilicon structures.

8. The integrated circuit of claim 1, each of the plurality of dummy polysilicon structures have a width in a range of from about 200 Å to about 300 Å.

9. An integrated circuit (IC), comprising:
   a semiconductor substrate having an interlayer dielectric layer, a dense polysilicon region, and one or more of a wide oxide diffusion (OD) region in the interlayer dielectric layer and a wide polysilicon structure, wherein the dense polysilicon region comprises a plurality of polysilicon structures that packed with respect to one another to define a first packing density; and a plurality of dummy structures arranged directly above the one or more of the wide oxide diffusion region and wide polysilicon structure, wherein the plurality of dummy structures are packed with respect to one another to define a second packing density, wherein the first packing density and second packing density are substantially similar, and wherein the plurality of dummy structures define an anti-dishing structure configured to generally inhibit a dishing of a surface of the one or more of the wide oxide diffusion region and wide polysilicon structure concurrent with a subsequent removal of the plurality of dummy structures via a chemical-mechanical polish of a surface of the semiconductor substrate.

10. The integrated circuit of claim 9, wherein the plurality of dummy structures are comprised of one of polysilicon and silicon nitride.

11. The integrated circuit of claim 9, wherein an upper surface of the plurality of polysilicon structures is below an upper surface of the plurality of dummy structures.

12. The integrated circuit of claim 11, wherein the upper surface of the plurality of polysilicon structures is below a lower surface of the plurality of dummy structures.

13. The integrated circuit of claim 11, wherein the plurality of dummy structures are defined in an upper surface of the wide polysilicon structure.

14. An integrated circuit (IC) defined in a semiconductor substrate, the IC comprising:

an inter-layer dielectric (ILD) layer;

a plurality of polysilicon structures disposed within the inter-layer dielectric layer, wherein the plurality of polysilicon structures are packed with respect to one another to define a first packing density;

one of a wide oxide diffusion (OD) region of the inter-layer dielectric layer or a wide polysilicon structure, wherein the wide oxide diffusion region or wide polysilicon structure is disposed proximate to the plurality of polysilicon structures; and a plurality of dummy structures disposed directly above the respective wide oxide diffusion region or wide polysilicon structure, wherein the plurality of dummy structures are packed with respect to one another to define a second packing density, wherein the first packing density and second packing density are substantially similar, and wherein the plurality of dummy structures define an anti-dishing structure configured to generally inhibit a dishing of a surface of the respective wide oxide diffusion region or the wide polysilicon structure concurrent with a chemical-mechanical polish of a surface of the substrate.

15. The integrated circuit of claim 14, wherein the plurality of dummy structures are comprised of one or more of polysilicon and silicon nitride.

16. The integrated circuit of claim 14, wherein an upper surface of the plurality of polysilicon structures is below an upper surface of the plurality of dummy structures.

17. The integrated circuit of claim 16, wherein the upper surface of the plurality of polysilicon structures is below a lower surface of the plurality of dummy structures.

18. The integrated circuit of claim 14, wherein the wide oxide diffusion region resides over an active device region.

19. The integrated circuit of claim 14, wherein the plurality of dummy structures are defined in an upper surface of the wide polysilicon structure.

20. The integrated circuit of claim 14, wherein the wide polysilicon structure has a width that is substantially greater than a width of one or more of the plurality of polysilicon structures.

* * * * *